United States Patent
Harder et al.

(10) Patent No.: US 8,908,729 B2
(45) Date of Patent: Dec. 9, 2014

(54) HIGH POWER SEMICONDUCTOR LASER DIODE

(75) Inventors: Christoph Harder, Schindellegi (CH); Abram Jakubowicz, Rüschlikon (CH); Nicolai Matuschek, Zürich (CH); Joerg Troger, Raron (CH); Michael Schwarz, Altendorf (CH)

(73) Assignee: II-VI Laser Enterprise GmbH, Zurich (CH)

( * ) Notice: Subject to any disclaimer, the term of this patent is extended or adjusted under 35 U.S.C. 154(b) by 1045 days.

(21) Appl. No.: 11/993,304

(22) PCT Filed: Jun. 28, 2006

(86) PCT No.: PCT/GB2006/050173
§ 371 (c)(1),
(2), (4) Date: Apr. 14, 2010

(87) PCT Pub. No.: WO2007/000615
PCT Pub. Date: Jan. 4, 2007

(65) Prior Publication Data
US 2010/0189152 A1    Jul. 29, 2010

(30) Foreign Application Priority Data
Jun. 28, 2005  (GB) .................................. 0513039.8

(51) Int. Cl.
*H01S 3/00* (2006.01)
*H01S 5/042* (2006.01)
(Continued)

(52) U.S. Cl.
CPC ........... *H01S 5/0425* (2013.01); *H01S 5/02276* (2013.01); *H01S 5/1039* (2013.01);
(Continued)

(58) Field of Classification Search
CPC .  H01S 5/0425; H01S 5/06825; H01S 5/2222; H01S 5/2227
USPC ......................... 372/29.013, 87, 38.05, 46.01
See application file for complete search history.

(56) References Cited

U.S. PATENT DOCUMENTS 5,343,486 A    8/1994  Itaya et al.
(Continued)

FOREIGN PATENT DOCUMENTS

JP    1986-283190    12/1986
(Continued)

OTHER PUBLICATIONS

Lee et al. ("The effect of bonding wires on longitudinal temperature profiles of laser diodes"; J. of Lightwave Technology, vol. 14, No. 8, Aug. 1996).*

(Continued)

*Primary Examiner* — Tod T Van Roy
(74) *Attorney, Agent, or Firm* — Fenwick & West LLP

(57) ABSTRACT

Semiconductor laser diodes, particularly broad area single emitter (BASE) laser diodes of high light output powers are commonly used in opto-electronics. Light output power and stability of such laser diodes are of crucial interest and any degradation during normal use is a significant disadvantage. The present invention concerns an improved design of such laser diodes, the improvement in particular significantly minimizing or avoiding (front) end section degradation at very high light output powers by controlling the current flow in the laser diode in a defined way. This is achieved by controlling the carrier injection, i.e. the injection current, into the laser diode in a novel way by creating single current injection points along the laser diode's longitudinal extension, e.g. along the waveguide. Further, the supply current/voltage of each single or group of current injection point(s) may be separately regulated, further enhancing controllability of the carrier injection.

13 Claims, 12 Drawing Sheets

(51) Int. Cl.

| | | |
|---|---|---|
| *H01S 5/022* | (2006.01) | |
| *H01S 5/10* | (2006.01) | |
| *H01S 5/16* | (2006.01) | |
| *H01S 5/20* | (2006.01) | |
| *H01S 5/22* | (2006.01) | |

(52) U.S. Cl.
CPC .............. *H01S 5/16* (2013.01); *H01S 5/2036* (2013.01); *H01S 5/22* (2013.01); *H01L 2224/48463* (2013.01)
USPC .................... 372/38.05; 372/29.013; 372/87; 372/46.01

(56) References Cited

U.S. PATENT DOCUMENTS

| | | | |
|---|---|---|---|
| 5,394,421 | A | 2/1995 | Ikawa et al. |
| 5,684,816 | A * | 11/1997 | Takagi ................. 372/44.01 |
| 5,844,931 | A | 12/1998 | Sagawa et al. |
| 5,974,070 | A | 10/1999 | Haase et al. |
| 6,373,875 | B1 | 4/2002 | Yu et al. |
| 6,426,967 | B1 | 7/2002 | Tanabe |
| 6,463,087 | B1 | 10/2002 | Ashida et al. |
| 6,782,024 | B2 | 8/2004 | Schmidt et al. |
| 2002/0024985 | A1 | 2/2002 | Takeuchi et al. |
| 2002/0159492 | A1 | 10/2002 | Yamamura |
| 2002/0181526 | A1* | 12/2002 | Gao ............................ 372/45 |
| 2003/0165169 | A1* | 9/2003 | Nomoto et al. ................ 372/46 |

FOREIGN PATENT DOCUMENTS

| | | |
|---|---|---|
| JP | 3-214684 A | 9/1991 |
| JP | 7-263811 A | 10/1995 |
| JP | 8-335742 A | 12/1996 |
| JP | 9-232689 A | 9/1997 |
| JP | 11-186662 A | 7/1999 |
| JP | 2000-22262 A | 1/2000 |
| JP | 2001-257423 | 9/2001 |
| JP | 2002-164611 A | 6/2002 |
| JP | 2003-17805 A | 1/2003 |
| JP | 2003-031894 | 1/2003 |
| JP | 2004-048080 | 2/2004 |
| WO | 2007/000614 | 6/2006 |

OTHER PUBLICATIONS

Great Britain Search Report for corresponding Application No. 0513039.8 dated Oct. 20, 2005.
International Search Report for corresponding PCT Application No. PCT/GB2006/050173 mailed May 11, 2007.
European Office Action for corresponding European Application No. 06 755 802.3 dated Apr. 14, 2011.
State Intellectual Property Office of the People's Republic of China, Chinese Patent Application No. 200680023687.4, Notification of the Fifth Office Action, Aug. 16, 2012, 3 Pages (Translation Only).
Japanese Patent Office, Notice of Reasons for Rejection, Japanese Patent Application No. 2008-518985, Mailed Sep. 25, 2012, 10 Pages.
JP Application No. 2008-518985 Office Action (Feb. 14, 2012) (English translation submitted).

* cited by examiner

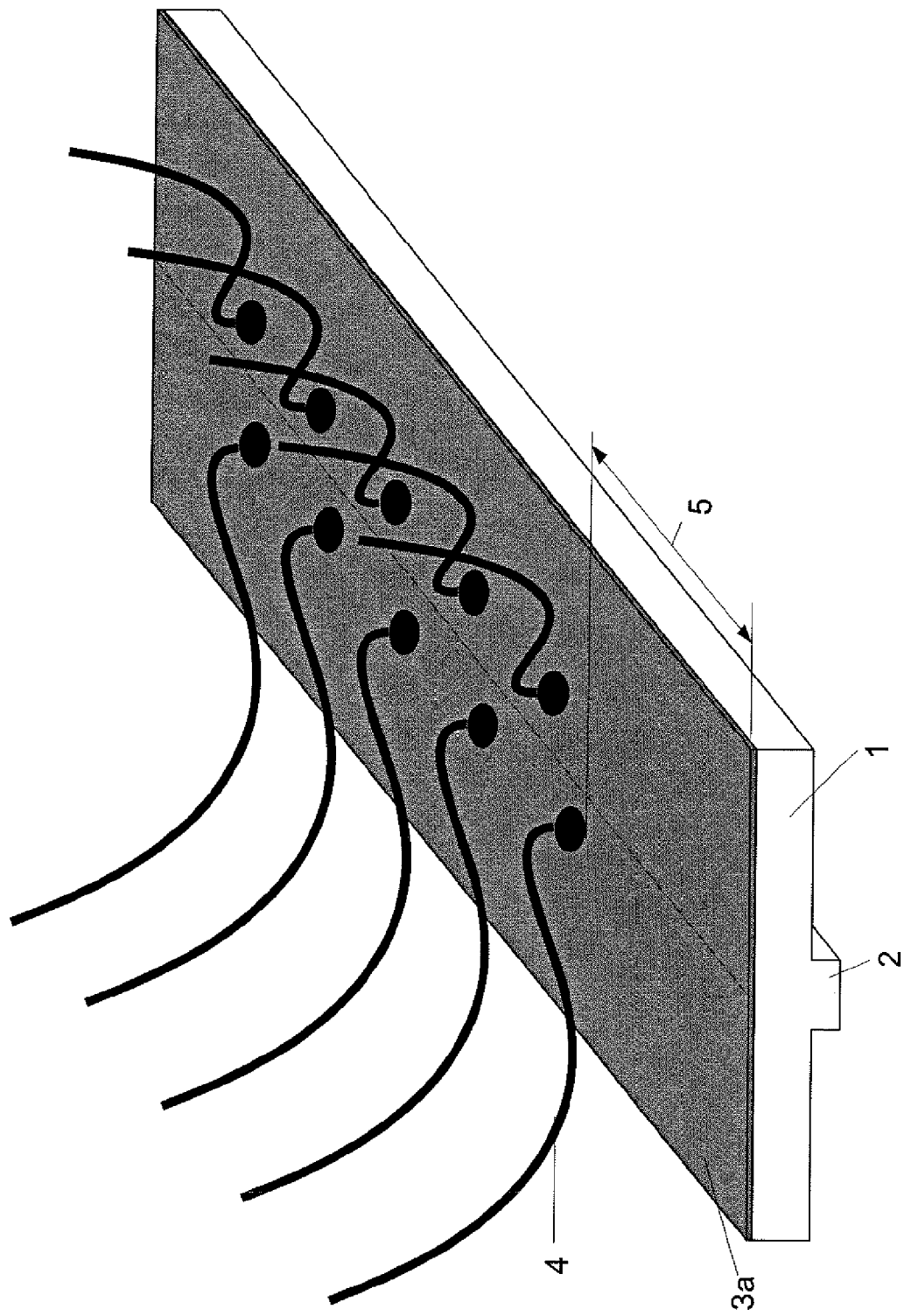

HIGH POWER SEMICONDUCTOR LASER DIODE

CROSS REFERENCE TO RELATED APPLICATIONS

This application is a national phase entry of International Application No. PCT/GB2006/050173, filed on Jun. 28, 2006, which claims the benefit of GB Application No. 0513039.8, filed Jun. 28, 2005.

BACKGROUND OF THE INVENTION

The present invention relates to semiconductor laser diodes, including in particular broad area single emitter (BASE) laser diodes of high light output power which are mounted junction side down on a carrier or submount. High output power in this context means laser diodes with at least 100 mW output. Such laser diodes are commonly used in opto-electronics and industrial applications. Light output power and stability of such laser diodes are of crucial interest and any degradation during normal use is a significant disadvantage. The present invention concerns an improved design of such laser diodes, the improvement in particular significantly minimizing or avoiding degradation of such laser diodes at very high light output powers by controlling the current flow in the laser diode in a defined way.

Semiconductor laser diodes of the type mentioned above have, for example, become important components in the technology of optical communication, particularly because such laser diodes can be used for fiber pumping and other high power laser diode applications. This allows to design all-optical fiber communication systems, avoiding any complicated conversion of the signals to be transmitted, which improves speed as well as reliability within such systems. Other uses of such high power laser diodes include cable TV (CATV) amplifiers, printing applications, and medical applications.

A typical semiconductor laser diode, e.g., an AlGaAs ridge waveguide laser diode consists of a (strained) quantum well active region sandwiched by two AlGaAs cladding layers. The first cladding layer, which is grown first onto the substrate, is commonly referred to as the lower cladding layer, and is typically n-type doped. The second cladding layer, which is grown second onto the substrate, after growth of the active region, is commonly referred to as the upper cladding layer and is typically p-type doped. The entire semiconductor epitaxial structure is grown on a GaAs substrate. A first electrode metallization provides electrical contact to the first cladding layer and a second electrode metallization provides electrical contact to the second cladding layer. Typically the first electrode covers the opposite surface of the wafer from that on which the epitaxial layers are grown, and the second electrode covers at least part of the ridge waveguide. However, other doping arrangements and locations of electrodes are also possible.

Generally, such a semiconductor laser diode can be operated in two different modes. Firstly, the device can be soldered with the first electrode onto a carrier or submount, which is referred to as a junction-side-up mounted laser diode (wherein the device is soldered to the carrier or submount with the substrate surface away from the carrier or submount). Typically, narrow-stripe (single-mode) lasers with a ridge width of a couple of microns are soldered in this way. Secondly, the device can be turned upside down and soldered with the second electrode onto a carrier or submount, which is referred to as a junction-side-down mounted laser diode. Typically broad area (multi-mode) lasers, BASE, with a ridge width of the order of 100-200 μm are soldered in that way. It should be noted that this invention may be preferably applied to junction-side-down mounted BASE laser diodes. However, it should be clear that the invention is in no way limited to such devices. In particular, the invention is not limited to ridge waveguide lasers as described above, but applicable to other designs of semiconductor laser diode, for example such as a buried heterostructure laser diode.

One of the major problems of all semiconductor laser diodes is the degradation in the end section area, particularly in the vicinity of the laser diode's front facet. This degradation is believed to be caused by uncontrolled temperature increase in the facet regions (or end sections) of the ridge waveguide, especially at high power outputs. The temperature increase may be caused by unwanted carrier recombination in these regions and heating due to free carrier injection.

The local current in the end section of the laser diode's ridge waveguide, and other parts of the laser diode, is generated by the injection current driving the laser diode. Thus, to reduce the local current density and to finally prevent current flow within the laser diode's end sections, and thus the unwanted carrier recombination, it is known to reduce the current injected into these end sections. Various designs for reducing the current injected into the end sections have been tested and described, including contact lift-off, removing the contact by etching, or otherwise interrupting the contact around these regions. Some of the tested and realized designs failed due to material, processing, or reliability problems, some show undesirable side effects, and some are just impractical or too difficult to implement.

Some known ways to prevent the above described carrier recombination in the laser diode's facet regions shall be described in the following.

One attempt is disclosed in Itaya et al. U.S. Pat. No. 5,343,486. It shows a compound semiconductor laser diode with a current blocking region formed in one facet portion of the laser diode structure. However, disadvantageously this design increases manufacturing complexity. Furthermore this approach would be unsuitable for industrial manufacturing using materials that oxidize rapidly, such as AlGaAs laser diodes, due to the rapid oxidation of the Al during processing with the method of Itaya.

Yu et al. U.S. Pat. No. 6,373,875 discloses a plurality of current-blocking layers, one each over each of the end sections of the laser diode's ridge waveguide and two separate blocking layers fully covering the remaining body right and left of the ridge waveguide. This structure thus has several layers which are laterally non-contiguous and the interruption just at the edge of the waveguide may lead to undesired effects.

Sagawa et al. U.S. Pat. No. 5,844,931 discloses a "windowed" current-blocking layer covering the ridge of a ridge waveguide laser diode and the whole body with a longitudinal opening, i.e. a window, over the center part of the ridge. Apart from the fact that some of the current blocking layers in this USP are actually conductive, not isolation layers, it discloses one single layer fully covering the laser diode body, with just a window over part of the ridge. Thus, the blocking layer is longitudinally not limited to the end section(s) of the laser diode. Also it seems that the manufacturing of such a windowed blocking layer process requires very careful alignment, especially of the window, to obtain the desired results and thus appears rather complex.

A rather successful approach is an "isolation layer" process to achieve the desired unpumped end sections in a ridge waveguide laser diode. This approach differs from earlier ones in the way that an additional thin isolation layer is placed between the semiconductor contact layer and the metal contact at the laser diode end sections. The semiconductor contact layer may even be removed. Such a design is disclosed by Schmidt at al. U.S. Pat. No. 6,782,024, assigned to the assignee of the present invention and incorporated herein by reference, showing a solution with so-called "unpumped end sections" by providing an isolation layer as current blocking layer of predetermined position, size, and shape between the laser diode's semiconductor material and the metallization.

Whereas, as shown above, unpumped end sections provide often successful solutions to block current flow in one or both end sections of a high power laser diode and thus prevent overheating and resulting catastrophic optical mirror damage (COMD) breakdowns, there are still occasions where this does not suffice. There appears to be one particular problem. Simulations of the spatial distribution of the injection current in high power laser diodes show a strong peak in the current density, i.e. a current spike, at the transition between the pumped and the unpumped section of the laser diode. This current spike stresses the material locally in the region concerned. Actually, material degradation in this region of laser diodes that have been operated for some time can be observed and are visible in electric beam-induced current (EBIC) signatures of the material at this very location. This effect is especially prominent at very high powers, with high injection current densities.

Thus, there remains in the art a need for another way of controlling the injection current distribution in the vicinity of a laser diode's end sections, perhaps even avoiding the current blocking layer or structure with its problematic transition area.

The present invention aims to provide a simple and reliable design for a high power laser diode, especially a BASE laser diode, which design provides a powerful stable light output under all operating conditions, but avoids the above-mentioned end section degradation. Another object is to provide an economical manufacturing method, allowing reliable mass production of such high power laser diodes without adding significantly to the complexity of the laser diode's structure.

SUMMARY OF THE INVENTION

The present invention provides a laser diode, especially a BASE laser diode, with so-called unpumped end sections, avoiding or reducing the current peak occurring at the transition between the pumped and the unpumped section. This is achieved by controlling the current distribution in the endangered region and, preferably, in the end sections. A laser diode according to the invention comprises at least two injection means, with an injection means providing electrical contact to each of two cladding layers between which is an active layer, whereby
at least one of said injection means has a metallization layer with an electrical connection, said electrical connection and/ or the thickness of the metallization layer being shaped or constructed such that a reduced current is injected into at least one of the laser's end sections.

According to one aspect of the invention, the control of the current distribution is established by providing distributed current injection means. A preferable form is an arrangement of separately wired contacts or contact points, i.e. a structured wire-bond configuration, preferably extending (and appropriately structured) along the laser diode's longitudinal extension. In contrast to prior art designs, the principle idea of the invention is in this case based on the proper choice of the spacing between the wired contacts and the distance of the wired contacts to the facet region(s). It should be clear however that the invention is not limited to current injection via wire bonds. The concept can be generalized to any means of current injection, e.g. via a conductive ribbon, see below.

Moreover, the invention is not limited to junction-side down mounted BASE laser diodes but can be applied to any kind of semiconductor laser diode.

According to another aspect of the invention, the laser diode is connected via a conductive ribbon-shaped electrical connector, or flat conductor, the dimensions of which are chosen such that the injection means produces the reduced current injection at one or both of the end sections. This flat conductor may extend over at least part of the length of the laser diode and may leave a predetermined section at the front and/or the back facet free.

According to a further aspect of the invention, the metallization layer is sufficiently thin such that a part, preferably adjacent to at least one end section, experiences a voltage drop, thus providing at least one unpumped end section.

According to a yet further aspect, a metallization layer of an injection means has a non-uniform thickness along its length (i.e. in a direction parallel to the laser waveguide between the facets), preferably with a thickness adjacent to a facet that is less than away from that facet, such that the region of the metallization that is less thick is not substantially equipotential with a thicker region. The thickness may change in a step-wise manner between different portions of the metallization, or may include tapered regions.

According to a still further aspect, the laser diode may include means for limiting the injection of carriers at least at one of the end sections, in particular by an insulation layer covering a portion of the laser diode adjacent to a facet. This may further reduce current injection within at least a portion of an end section.

A high power laser diode structured according to the present invention exhibits a substantial improvement over prior art laser diodes, especially with regard to its long-term stability and reliability, as will be shown.

This significant improvement may be effected by no more than a moderate increase in manufacturing complexity so that conventional manufacturing equipment may be used and usual manufacturing processes may be applied.

As briefly mentioned above, the provision of one or two unpumped or less pumped end section(s) in a ridge waveguide laser diode is to relax high stress areas close to the laser diode's facets. Due to a crystal inhomogeneity (e.g. often produced by cleaving the laser cavity) and high optical power densities within these regions, especially in the front facet or front mirror vicinity, the regions adjacent to the mirrors are believed to be the weakest points within the whole laser diode in terms of reliability.

Particularly in the front facet region, an increased failure rate at very high optical output powers can be observed. The same was found, though to a lesser degree, in the vicinity of the back mirror. Since the material degradation in these high stress regions is accelerated by a combination of optical power density and electrical current density, it seems advantageous to control and/or reduce the latter. According to the present invention, this is effected by establishing one or two unpumped end section(s) and controlling the current injection to these end sections and in their vicinity. An additional, appropriately placed current blocking layer may be used to improve the unpumped end section function.

In a preferred embodiment of the invention at least one of the end sections is the region of the laser diode between a facet and the electrical connection. In this case the electrical connection may comprise an arrangement of a plurality of electrical connections, the dimensions of said arrangement being such that the injection means produces the reduced current injection at least one of said end sections. The plurality of electrical connections may comprise a plurality of singular electron or hole injection points extending closely spaced essentially along the length of said laser diode, a first one of said singular injection points being located at a predetermined distance from said front and/or said back facet, respectively. Alternatively the electrical connection may comprise a ribbon-like electrical connection, the dimensions of which are such that the injection means produces the reduced current injection at least one of said end sections. The ribbon-like electrical connection may extend over at least part of the length of the laser diode, preferably leaving a predetermined section at the front and/or the back facet free.

Furthermore the injection means may comprise a second metallization layer and an associated, shaped or unshaped second electrical connection. The minimal current density within the at least one end section may be at least 75% below the average current density in the active layer. The laser may be a ridge waveguide laser, preferably a narrow stripe, junction-side-up laser, or a broad area single emitter (BASE) laser, preferably a junction-side-down laser, or a buried heterostructure laser. Furthermore the injection means may comprise a plurality of wired contacts, especially closely spaced wire bonds. The plurality of wired contacts may be distributed such that at least one end section is free from wired contacts, said end section having a predetermined length, said predetermined length being preferably between 10% and 25% cent of the total length of the laser diode, or preferably between 200 μm and 600 μm. Furthermore the distance between the current injection points may be constant.

If required the separation between adjacent current injection points may vary for at least for some of the current injection points depending on the location along the laser diode, in particular increases towards at least one of the facets. The current injection points may be placed along the device in one single row. Alternatively the current injection points may be placed along the device in more than one row, said rows being preferably offset against and/or parallel to each other. The distance between the current injection points may be less than 200 μm, preferably less than 125 μm. Alternatively the distance between the current injection points may be less than the effective penetration depth $\alpha_{eff}$, preferably between 0.4 $\alpha_{eff}$ and 0.8 $\alpha_{eff}$. The distance of the injection points from at least one of the end sections may be at least 100 μm, preferably at least 200 μm, and may be up to 500 μm. Alternatively the distance of the injection points to at least one of the end sections may be at least 0.5 $\alpha_{eff}$, preferably between $\alpha_{eff}$ and 3 $\alpha_{eff}$, wherein $\alpha_{eff}$ is the effective penetration depth.

The laser diode may further include means for limiting the injection of carriers at least at one of the end sections, said injection limiting means comprising an insulation layer covering a portion of the laser diode adjacent to a facet such as to further reduce current injection within at least a portion of an end section. The insulation layer may laterally extend over at least part of the semiconductor body and longitudinally covers only at least one end section, whereby said isolation layer may be located between either metallization and its respective cladding layer (e.g. on either side of a ridge waveguide laser diode with metallizations on opposite surface), or between both.

Two separate injection limiting means may be provided, one each at the front and the back end section of the laser diode. The injection limiting means may comprise an insulation layer with a longitudinal extension of between 25 μm and 500 μm. The injection limiting means may comprise an insulation layer with a longitudinal extension of less than 2 $\alpha_{eff}$, preferably in the range 0.5 $\alpha_{eff}$ to 1.5 $\alpha_{eff}$. The injection limiting means may be an insulation layer of 10 nm to 100 nm thickness, preferably between 40 and 60 nm thickness.

BRIEF DESCRIPTION OF THE DRAWINGS

In the following, an embodiment of the invention shall be described by reference to the drawings, in which:

FIGS. 3a to 3e illustrate five embodiments of the invention;

DETAILED DESCRIPTION OF THE DRAWINGS

Figure 1:
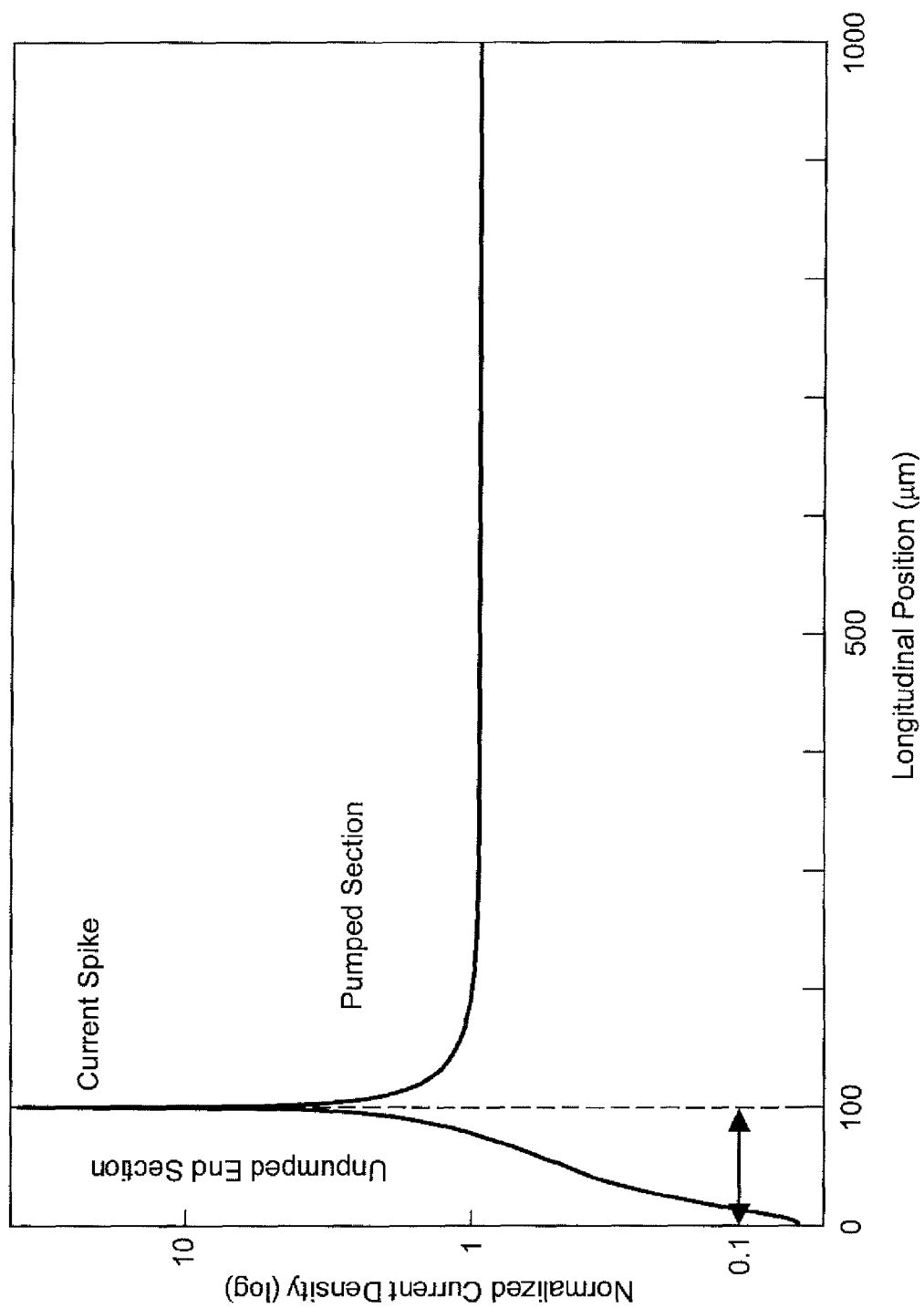
FIG. 1 shows a simulation of the longitudinal current density distribution in the active layer of an exemplary BASE laser diode with a current blocking layer placed at the left facet and homogeneous current injection from top of the device.

FIG. 1 shows the injection current density distribution in a longitudinal direction in the active layer of an exemplary BASE (broad area single emitter) ridge waveguide laser diode with an unpumped end section provided by a region of current blocking layer adjacent to the facet and homogeneous current injection according to the prior art. It should be understood that FIG. 1 is a simulation and that the dimensions and values shown are examples only. It should also be understood that this invention is not limited to junction-side down mounted BASE lasers but may be applied to any laser diode of a similar structure or of a design for which a control of the injection current is beneficial or required.

The longitudinal injection current distribution shown in FIG. 1 assumes a homogeneous first gold metallization layer of $d_{cont}=1.0$ μm thickness in electrical contact with a first cladding layer, which in this case is an n-cladding layer. Consequently, the current injection is almost homogeneously distributed along the device in the active layer, except for the unpumped end section and the adjacent region. A thick metallization providing a substantially homogeneously distributed current injection is considered attractive in the prior art to maximize the current flow to the device. The unpumped end section is provided by an insulating current blocking layer (the outline of such a current blocking layer is visible in FIG. 2) between the second thick metallization and the second cladding layer, which in this case is a p-cladding layer, starting at the facet and extending over a length of 100 μm. This current blocking layer modifies the current distribution within the device, producing the described undesirable and detrimental spike of the injection current density within the device aligned with the edge of the current blocking layer (i.e. the boundary between the pumped and the unpumped sections the laser diode's waveguide). Please note that the vertical axis has a logarithmic scale.

Thus, whereas unpumped end sections are successfully used to block current flow in the end section, i.e. in the vicinity of the facet (mirror), of high power diode lasers and thus prevent overheating and resulting COMD (catastrophic optical mirror damage) at the facet, strong peaks or spikes in the current density at the transitions between pumped and unpumped sections, as shown in FIG. 1, are a great disadvantage.

Figure 2:
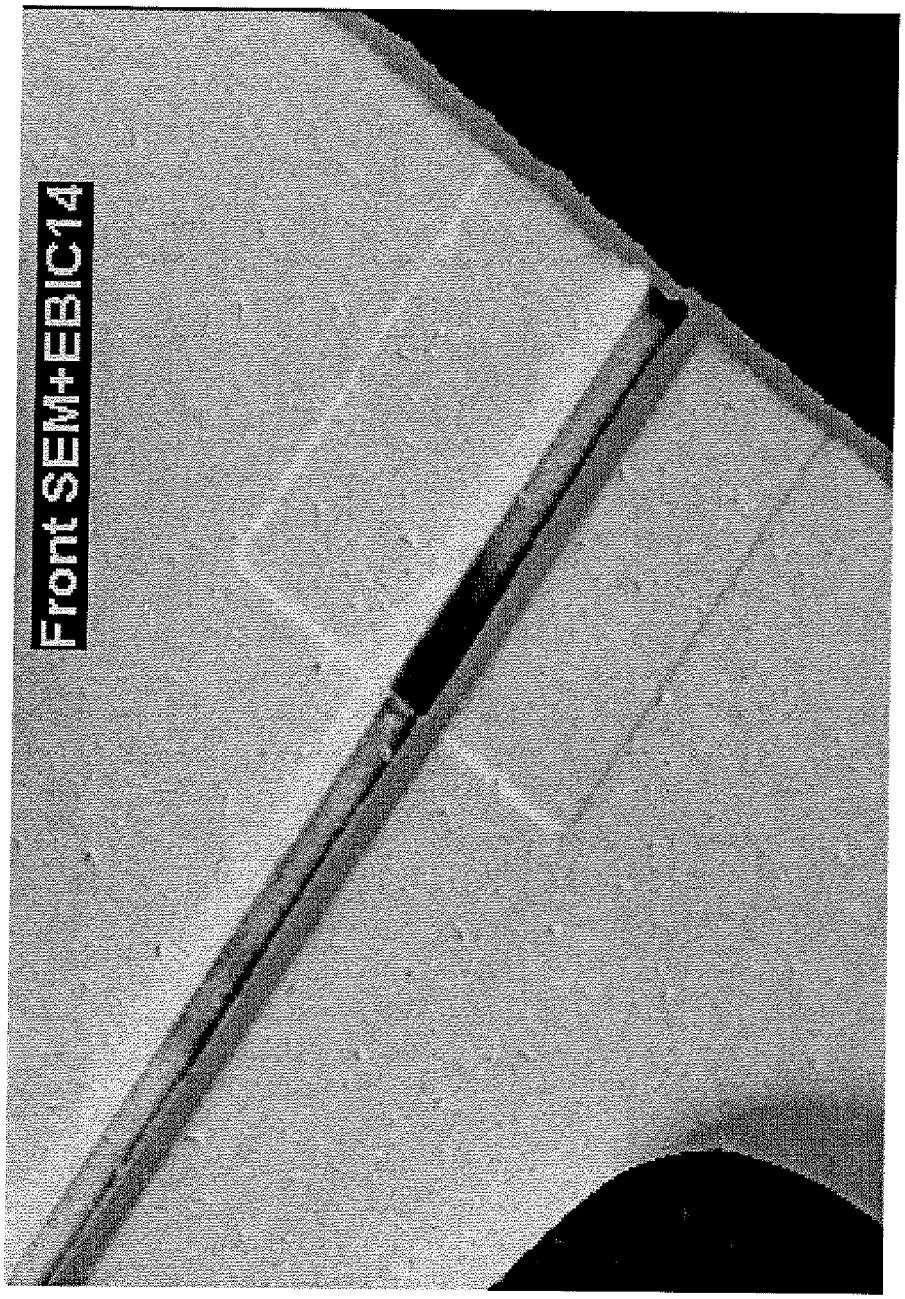
FIG. 2 depicts a superimposed EBIC and SEM picture of a degradation of a junction-side-up mounted, narrow-stripe laser diode below the end of the unpumped end section.

FIG. 2 illustrates the result. As can be seen from this superimposed EBIC (electron-beam induced current) and SEM (scanning electron microscope) picture of a junction-side-up mounted, narrow-stripe laser diode which has been operated for some time at high current, the material in the unpumped end section is seriously degraded, particularly at the pumped/unpumped transition. Of course, this effect is especially prominent at very high powers, i.e. very high injection current densities.

Figure 3A:
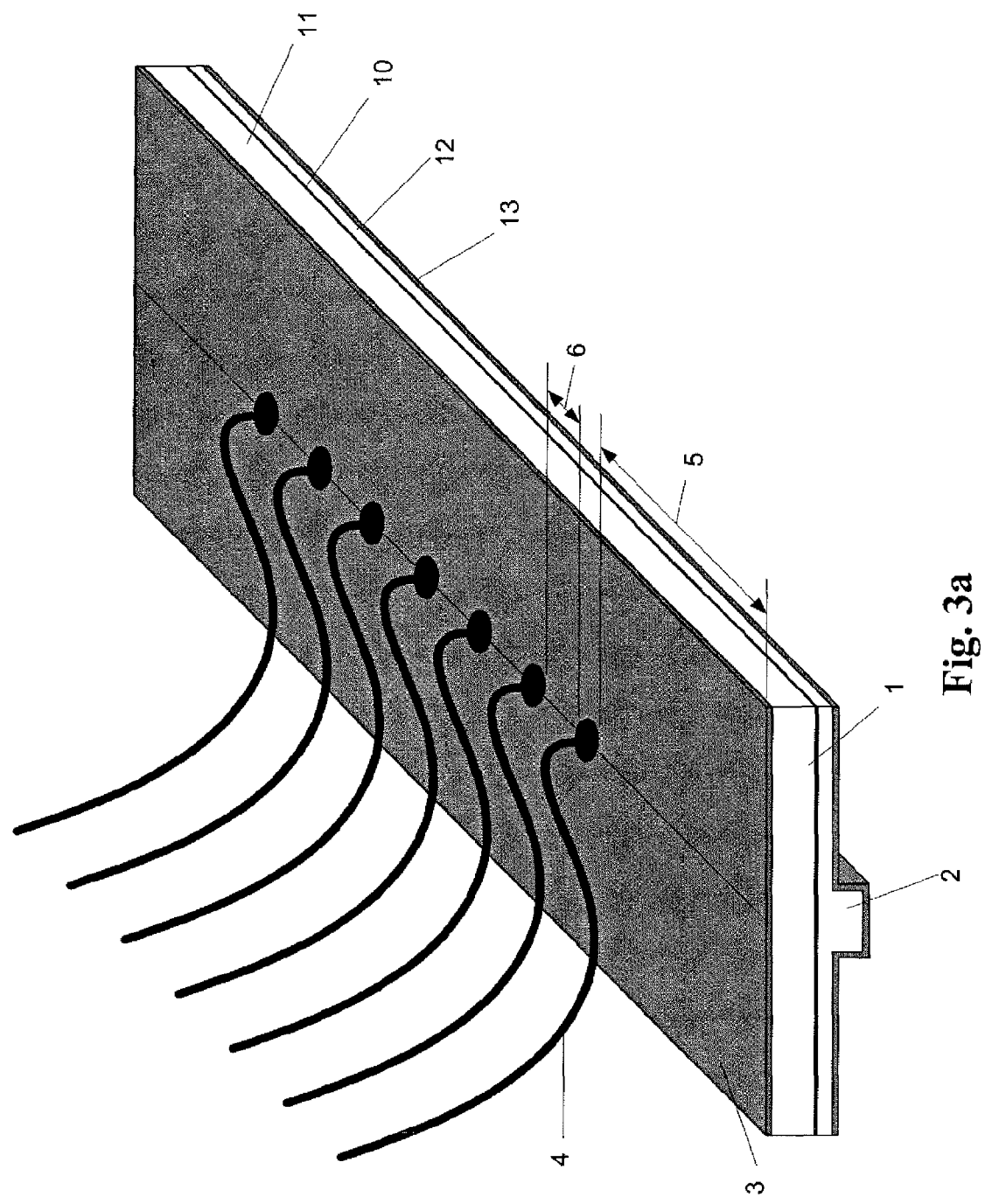

FIGS. 3a to 3e shows various embodiments of the invention, solving the above-described problem. The figures show an exemplary BASE laser diode with its waveguide ridge in junction-side-down direction. FIG. 3a shows the active layer 10, first cladding layer 11, second cladding layer 12 and second metallization (electrode) layer 13, which are not shown in subsequent figures for clarity (the carrier or submount beneath the device is not shown in any of the FIGS. 3a to 3e). To eliminate the local current spike at the pumped/unpumped transition, the spatial distribution of the current injection is controlled. In the exemplary embodiment of FIG. 3a, the wire bonds 4 are distributed on the first gold metallization layer 3 of the junction-side-down oriented laser diode 1 with its waveguide ridge 2. The thickness of the first metallization layer, $d_{cont}$, is chosen significantly below 1 μm, e.g. less than 0.5 μm, preferably less than 0.2 μm, and yet more preferably less than 0.1 μm, so that the layer acts as a resistor with a certain voltage drop. As a result, the current distribution provided by this "thin" metallization layer is substantially inhomogeneous; i.e. a significantly thicker metallization layer would be required to provide a substantially equipotential metallization with a more homogeneous current distribution. In particular, the "first" wire bond, i.e. the wire bond nearest to the laser diode's left (and/or right) facet is located a predetermined distance away from the particular facet. Thus in this arrangement, we define the region between the "first" wire bond and the facet as the end section 5; it is a region of reduced carrier injection so that the degree of carrier injection in the active layer decreases continuously towards the facet. As a result, the region close to the facet is left substantially unpumped, whereby the injection current so-to-speak tapers off towards the facet. On the other hand, for a typical application, the spacing between neighboring wire bonds 6 is chosen small enough, depending on thickness of the metallization layer, $d_{cont}$, to guarantee an essentially homogeneous current distribution between the wire bonds.

One should note that in prior art designs, no care was taken about the number of wire bonds, or the distance between facet and "first" wire bond, or the spacing between two neighboring wire bonds. For a metallization layer with a thickness of a couple of micrometers, its resistivity is negligible so that the current injection is substantially homogeneous and independent of the number and positioning of wire bonds. In fact, for "thin" metallization layers, i.e. below 1 μm, the influence of its resistivity was still disregarded in the prior art, although for this case the design of the wire-bond configuration is crucial.

Some dimensions and measures for the distances between the wire bonds and between the wire bond(s) and the facet(s) are discussed below. These measures strongly depend on the thickness $d_{cont}$. Generally, the distance from the outermost wire bond(s) to the facet(s) should be chosen such that the current density is suppressed sufficiently at the facet. Moreover, the current spike associated with prior art use of a current blocking layer will be reduced if current blocking layers are also incorporated in the design of the invention, for example between the second metallization layer and the corresponding second cladding layer (e.g. typically across the ridge). The free distance at the end of the laser diode may be typically a few hundred μm. The space between the leftmost (first) and the rightmost (last) wire bond in FIG. 3a is filled with several other wire bonds at a distance such that a homogeneous current distribution is guaranteed between the wire bonds. A typical number for this distance between neighboring wire bonds is 100-200 μm for $d_{cont}$=0.2 μm, whereby the distance 6 is defined by the free space between neighboring bonds, excluding the extension of the bond itself, typically 50-100 μm. This configuration of wire bonds provides a substantially smooth increase of the current density starting from very low values at the facets, resulting in unpumped end sections, without requiring any current-blocking structure as in prior art devices. In addition, the current density between the wire bonds along the longitudinal extension of the laser diode can be precisely controlled, e.g. can be made rather homogeneous if so desired.

The plurality of wire bonds 4 may be at least two, preferably at least three, more preferably at least five, yet more preferably at least ten and most preferably at least twenty.

Figure 3B:
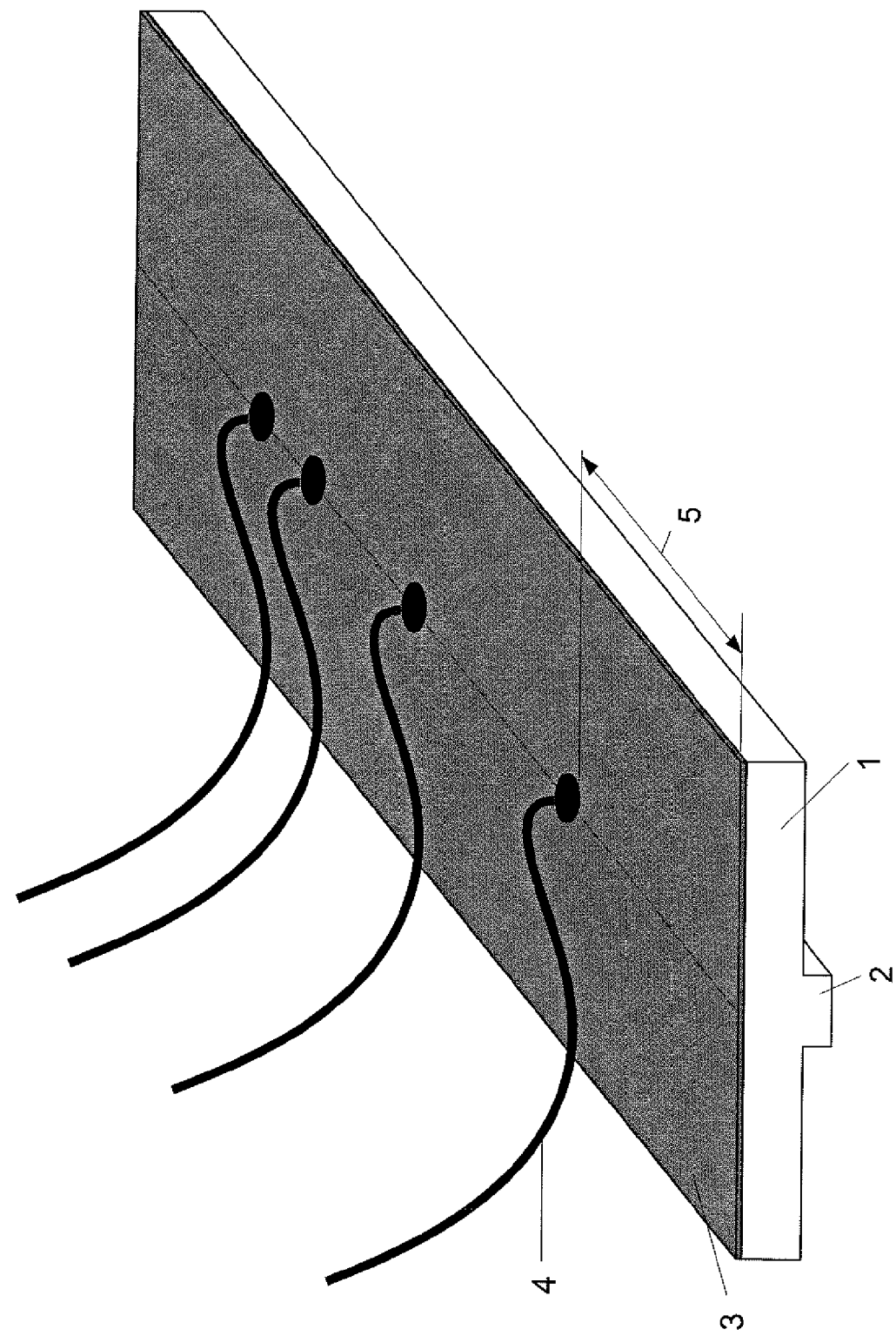

FIG. 3b shows a second embodiment of the invention with the same reference numbers as in FIG. 3a. Whereas the region of reduced carrier injection is approximately the same as in FIG. 3a, the wire bonds 4 are unevenly (or non-uniformly) distributed, i.e. their distance from each other varies. Implementing such a variable physical distribution allows the designer a further degree of freedom to create a desired injection current distribution along the laser diode 1. This approach may further minimize stressing of the laser diode and also enable optimization of the current injection profile as a function away from the facets and associated regions of reduced carrier injection and thus enable an increased power output without the danger of a COMD. An approach might be to reduce (or increase) the density of wire bonds, i.e. increase (or decrease) their spacing, in the direction to the front facet of the laser diode, resulting in a substantially continuous decrease (or increase) of the current density in this direction.

FIG. 3c shows a further embodiment with two rows of wire bonds which may be offset or shifted by a certain distance. Also, the distance between the two rows and/or the number of parallel rows may be varied. This design is particularly useful if an increased number of wire bonds is desired. The embodiment of FIG. 3c uses a "thin" metallization layer, as described above.

Figure 3D:
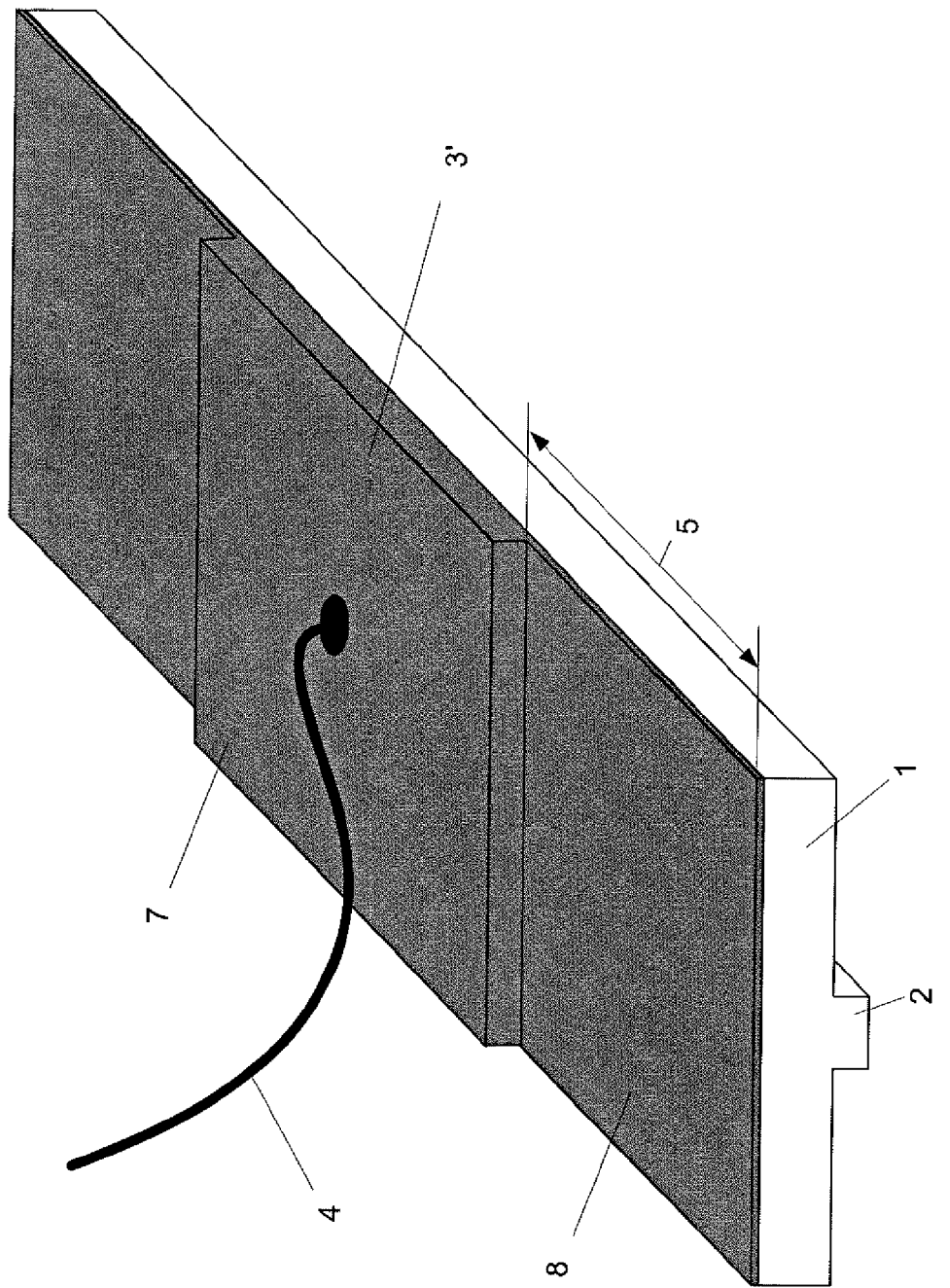

FIG. 3d depicts a further embodiment of the invention in which a metallization layer 3' of non-uniform thickness is used to tailor the current injection profile of the laser as a function of length (parallel to the waveguide between the facets). In this embodiment the thickness of the metallization layer 3' is thinner in a portion 8 adjacent to the facet than in a portion 7 away from said facet. Preferably the thinner portion 8 of the metallization layer 3' provides a corresponding region of reduced carrier injection, and the thicker portion 8 provides a corresponding region of greater and substantially uniform carrier injection. Preferably the thickness of the thinner portion 8 is less than 1 μm, preferably less than 0.5 μm, more preferably less than 0.2 μm, and yet more preferably less than 0.1 μm. The thickness of the thicker portion 7 is preferably at least 1 μm. The metallization layer 3' may comprise more than two different thicknesses, to produce a stepped arrangement. In another arrangement the metallization layer may be tapered portions of the electrode 3'.

Figure 3E:
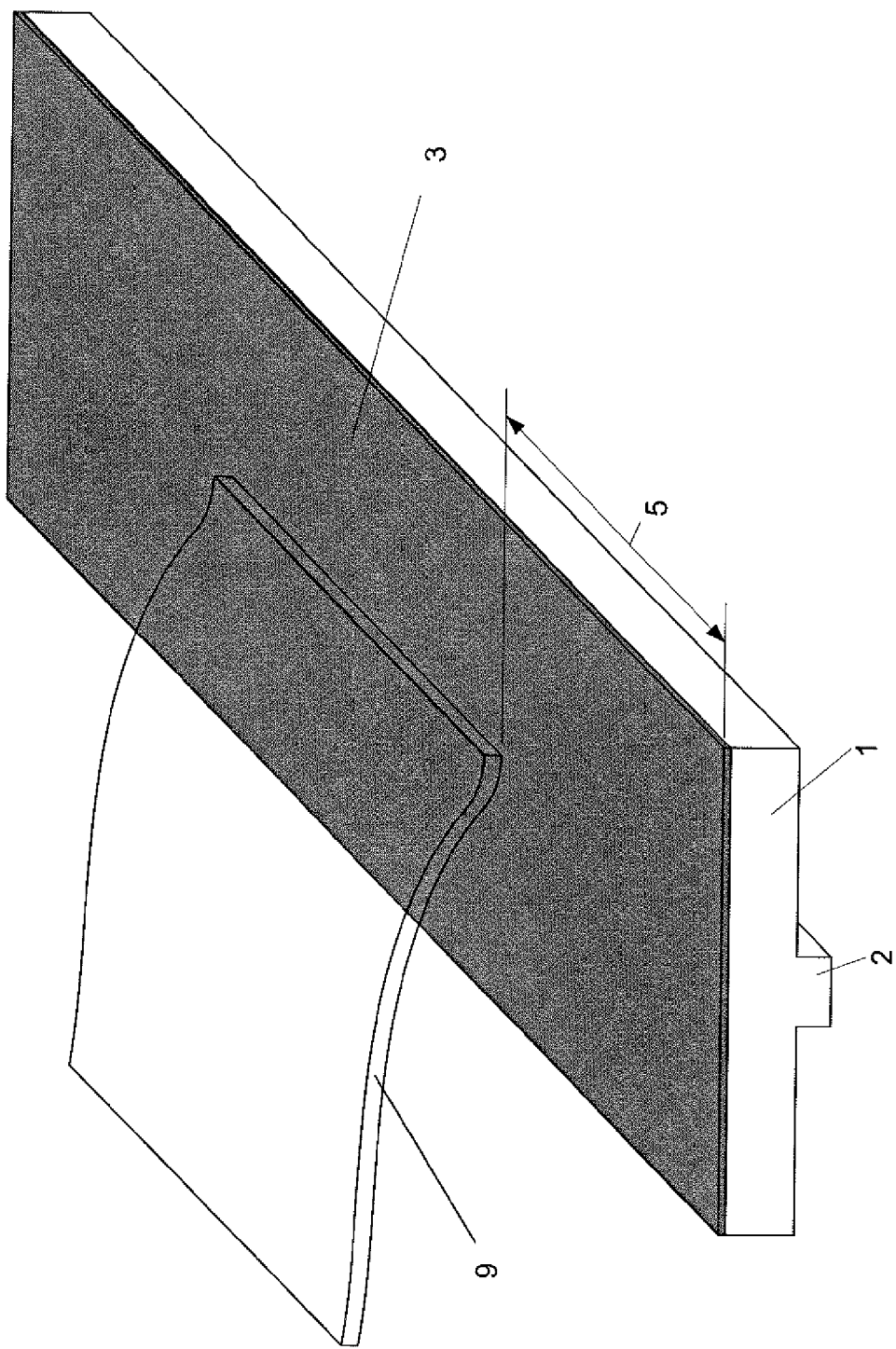

FIG. 3e depicts a still further embodiment where current injection is provided by a conductive ribbon 9 which extends in a longitudinal direction over a certain distance depending on the thickness of the metallization layer 3. This embodiment may be realized both with a "thin" or a "thick" metallization layer 3.

In the embodiments shown in FIGS. 3a-e, no current blocking layer(s) on the p-contact side is (are) required because current injection is suppressed by the regions of reduced current injection. However, further control of the current injection profile may also be provided by the use of current blocking layers, as per the prior art, in any of the designs described above. The current blocking layers may be provided between either or both metallization layers and their respective cladding layers.

Another approach for implementing a variable injection current distribution, i.e. an injection current varying along the laser diode, is to control the current of the different wire bonds 4 to produce the desired current injection profile within the device. The person skilled in the art will be able to devise appropriate circuitry. Moreover, it should be clear that any of the designs mentioned and/or presented in FIGS. 3a-3d can be combined and modified by a person skilled in the art.

Figure 4:
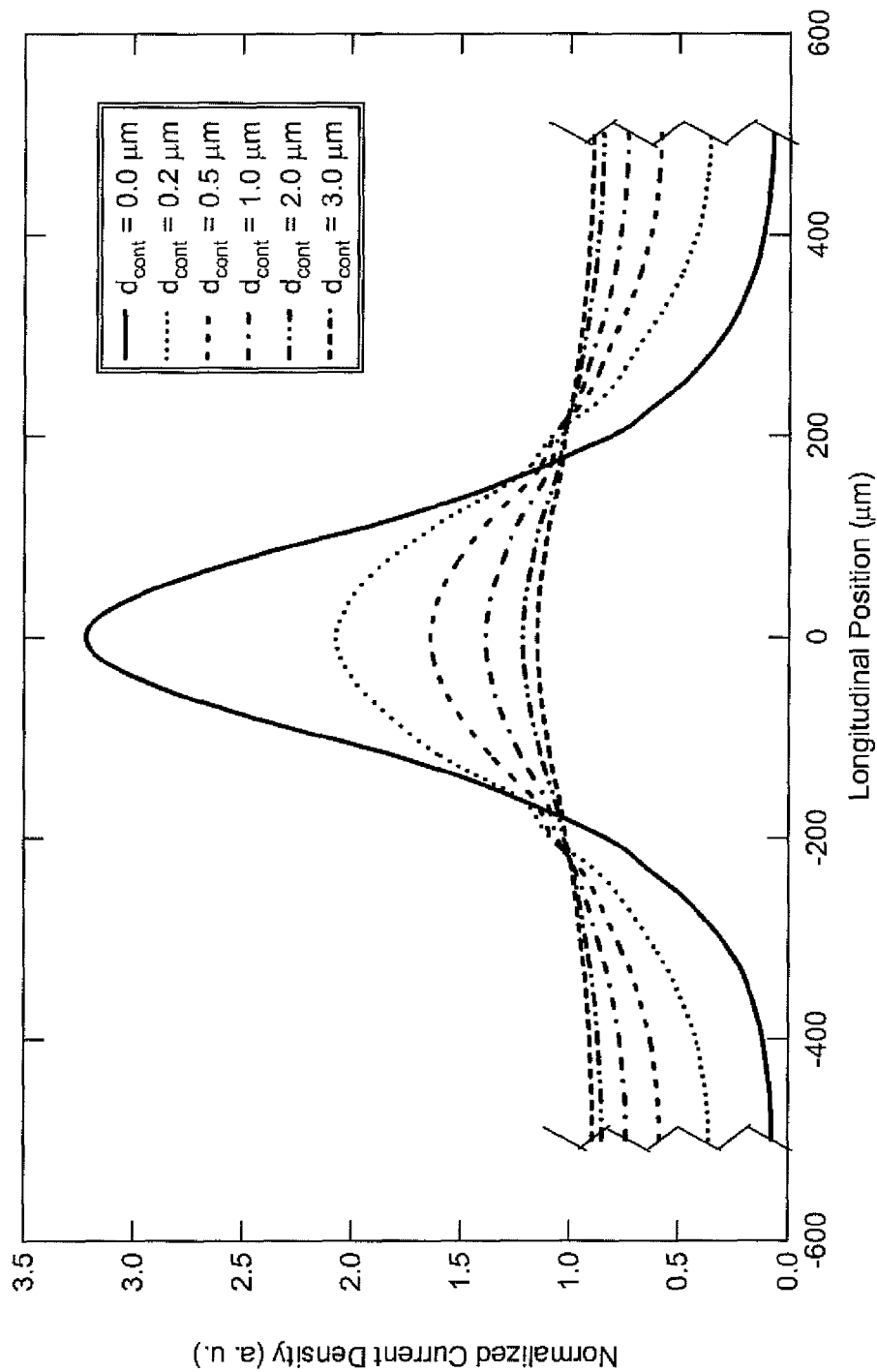
FIG. 4 depicts a simulation of the current density distribution in the active layer of an exemplary BASE laser diode with current injection from a single wire bond, using the thickness of the conducting metallization layer as a parameter.

FIG. 4 is provided to further explain the correlation between the thickness of the metallization layer and the current injection distribution within the device. FIG. 4 depicts a calculated simulation of the injection current density distribution in the active layer of a BASE laser diode with current injection from a single wire bond on top of the device located at the origin for different thicknesses of the gold contact layer. The 1-mm long section, indicated as "longitudinal position" in the drawing, should be considered as a cut-out of a longer chip. Note that the current density is normalized so that the integrated current density (i.e. the total current) is the same for each of the simulations. As would be expected, the current density in the active layer has a maximum at the feeding point which is the origin and decreases towards both ends of the laser diode. The thicker the (gold) metallization layer, the shallower is the current density distribution, i.e. for a "thick" metallization layer the distribution becomes more homogeneous than for a "thin" layer. The steepness and width of each curve is described by a parameter we refer to as effective penetration depth. The effective penetration depth is a measure for the current spreading in the active layer for carriers, which are injected from an ideal point source on top of the device. The effective penetration depth can be derived as function of the metallization layer thickness by fitting an analytic function composed of hyperbolic functions to the simulated curves. The fit formula follows from an equivalent transmission-line representation of the device.

Figure 5:
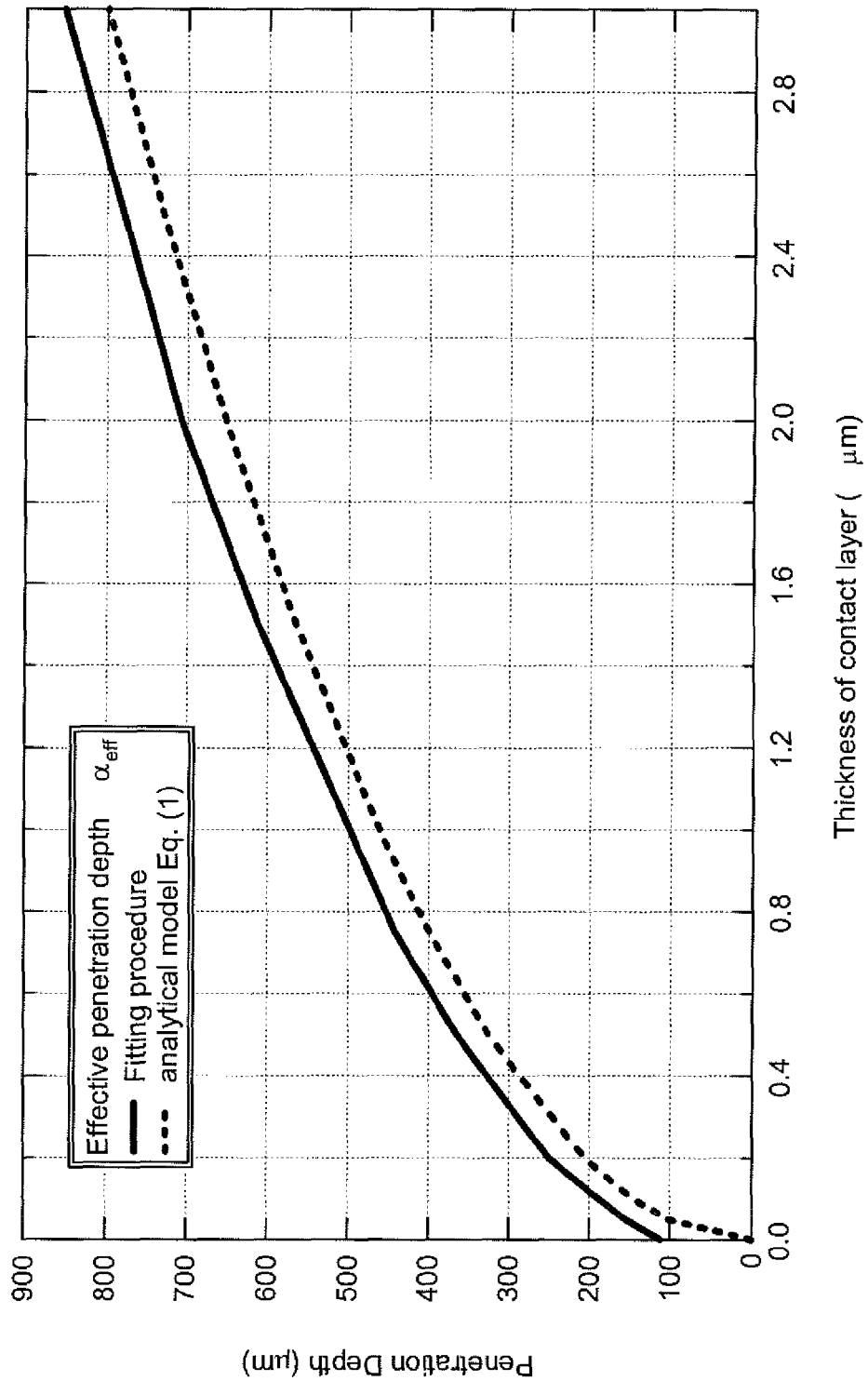
FIG. 5 shows the effective penetration depth as function of the thickness of the metallization layer, derived from an equivalent transmission line representation of the device.

The solid line in FIG. 5 shows the effective penetration depth, $\alpha_{eff}$ as obtained from the fitting procedure. The penetration depth approximately follows a square-root dependence. The transmission-line model allows one to derive an approximate analytic expression for the effective penetration depth that is given by $$\alpha_{eff} = \sqrt{2 \frac{\sigma_{cont}}{\sigma_{sub}} d_{sub} d_{cont}}. \quad (1)$$

In Eq. (1), $\sigma_{cont/sub}$ denotes the conductivity and $d_{cont/sub}$ the (vertical) thickness of the metallization layer material and the substrate material, respectively. The dashed line in FIG. 5 shows the effective penetration depth, as given by Eq. (1) for $\sigma_{cont}=42.55 \cdot 10^6 \Omega^{-1} m^{-1}$, $\sigma_{sub}=60000 \Omega^{-1} m^{-1}$, and $d_{sub}=150$ μm. There is a good congruence between both curves. It should be noted that Eq. (1) is derived for junction-side-down mounted (BASE) lasers where relatively thick substrate material is sandwiched between the first metallization layer and the active layer. For junction-side-up mounted lasers, a different expression might be derived. Nevertheless, the concept of effective penetration depth can be applied independent of the underlying theoretical model.

Figure 6:
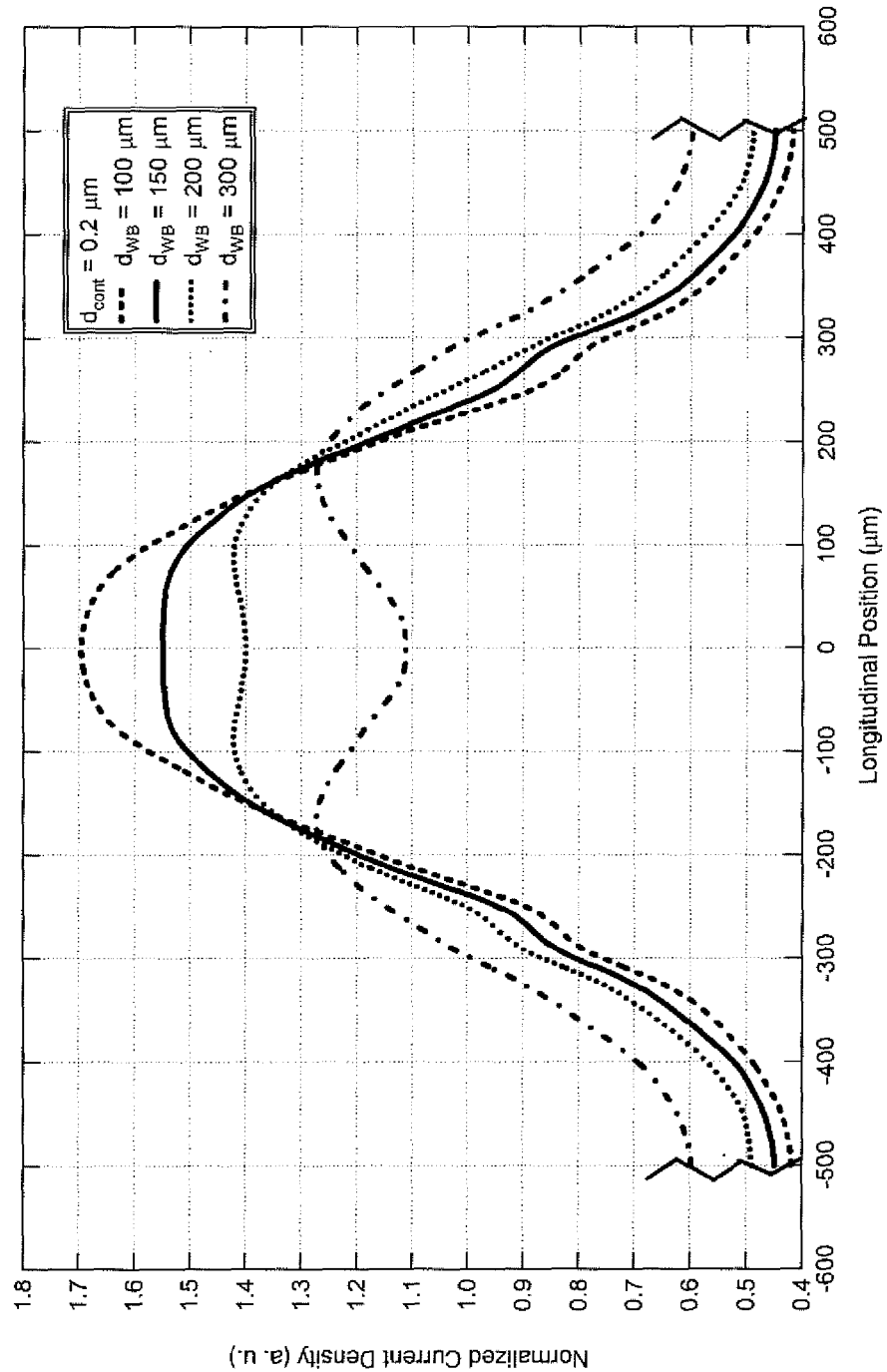
FIG. 6 depicts a simulation of the current density distribution in the active layer of an exemplary BASE laser diode with current injection from two neighboring wire bonds, whereby the distance between the wire bonds is used as a parameter.

FIG. 6 depicts a calculated simulation of the injection current density distribution in the active layer of a BASE laser diode with current injection from two neighboring wire bonds on the first metallization layer of the device for different separation of the two bonds. The thickness of the (gold) metallization layer is 0.2 μm. As can be seen, for distances smaller than 150 μm, the current density between both bonds is uniform or has a maximum, while it strongly drops outside. For separations greater than 150 μm, a dip in the current density between both wire bonds occurs. It was found from the simulations that the following empirical relation holds for the critical distance between two wire bonds and the effective penetration depth as function of the contact layer thickness $$d_{WB}^{crit}(d_{cont}) \approx 0.6 \cdot \alpha_{eff}(d_{cont}). \quad (2)$$

If two wire bonds are separated by less than $d_{WB}^{crit}$, the current density between neighboring wire bonds does not display a localized minimum or ripple.

As a rule of the thumb, the distance of the wire bond located closest to the facet should be chosen to be on the order of $$d_{WB}^{facet}(d_{cont}) \approx 2 \cdot \alpha_{eff}(d_{cont}). \quad (3)$$

Depending on the degree of desired reduction of current density at the facet(s) this value can be increased or decreased.

As an example, for $d_{cont}=0.2$ μm, one finds from FIG. 5 an effective penetration depth $\alpha_{eff}=250$ μm yielding a critical distance $d_{WB}^{crit}=150$ μm according to Eq. (2) and a distance to the facet of C=500 μm according to Eq. (3).

Figure 7:
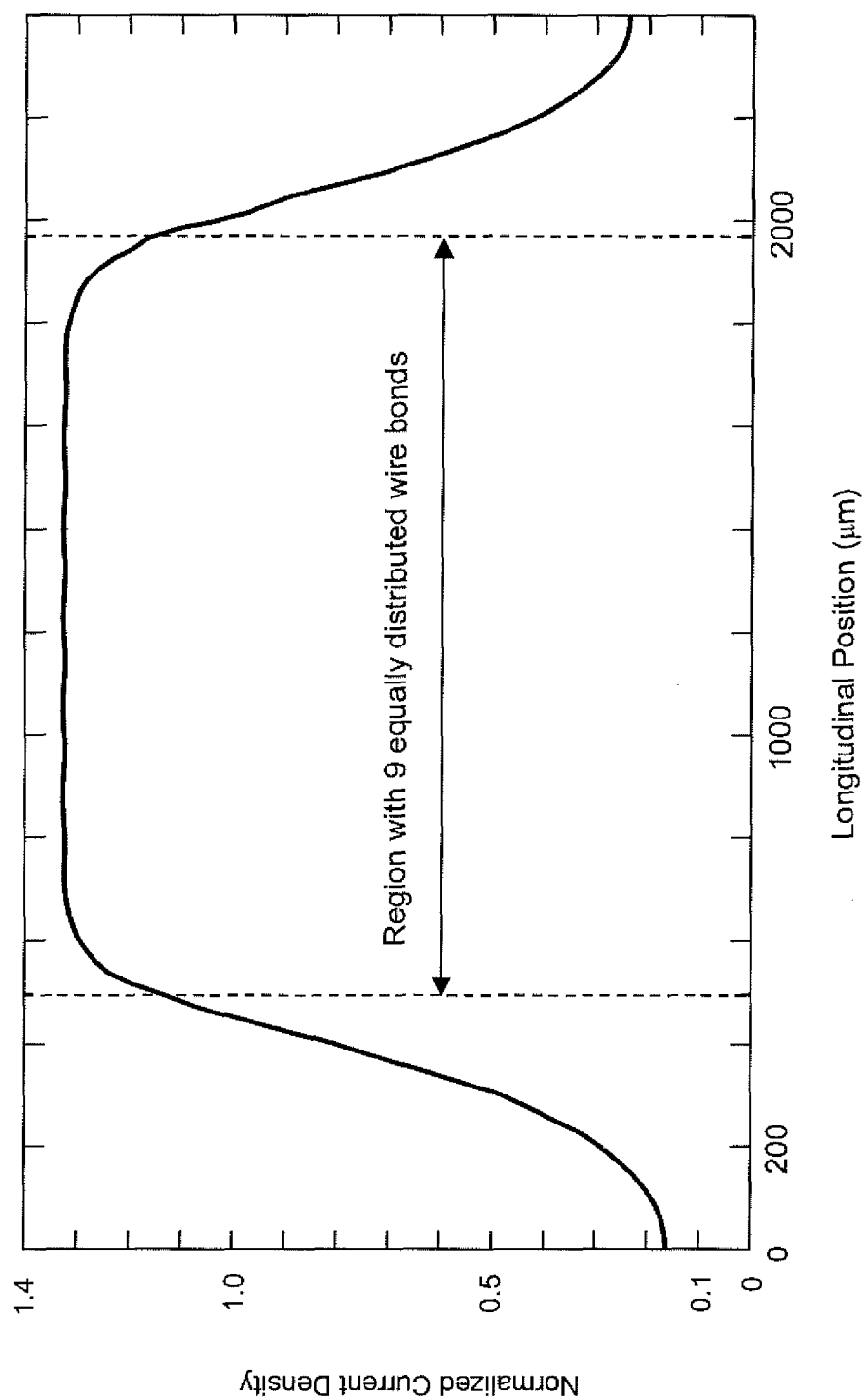
FIG. 7 shows a simulation of the longitudinal current density distribution in the active layer of an exemplary BASE laser diode with current injection from a plurality of equally distributed wire bonds on top of the device according to the invention.

FIG. 7 illustrates the improvement achieved by the present invention in a representation similar to FIG. 4, using the values of the critical distance and the distance to the facet above in the example. As in FIG. 4, a simulated current density distribution is shown. But in the case of FIG. 7, the active layer of a 2.4 mm long BASE laser diode receives current injection from nine wire bonds on the first metallization layer of the device, essentially in a configuration as shown in FIG. 3a (where only seven wire bonds are shown). The wire bonds are equally distributed in the longitudinal direction starting approximately 500 μm from the left facet of the laser diode and ending about 400 μm from its right facet. The separation between two adjacent wire bonds is about 100 μm. No current blocking layers operating as physical unpumped end sections are assumed. This provides a substantially uniform current density in the region with the wire bonds and a rather steep decline towards the laser diode's facets. The effect of such a laser diode design is thus quite similar to a design with current blocking layers at the ends of a laser diode, i.e., the end sections of the laser are practically unpumped, but without producing any current spike.

Figure 8:
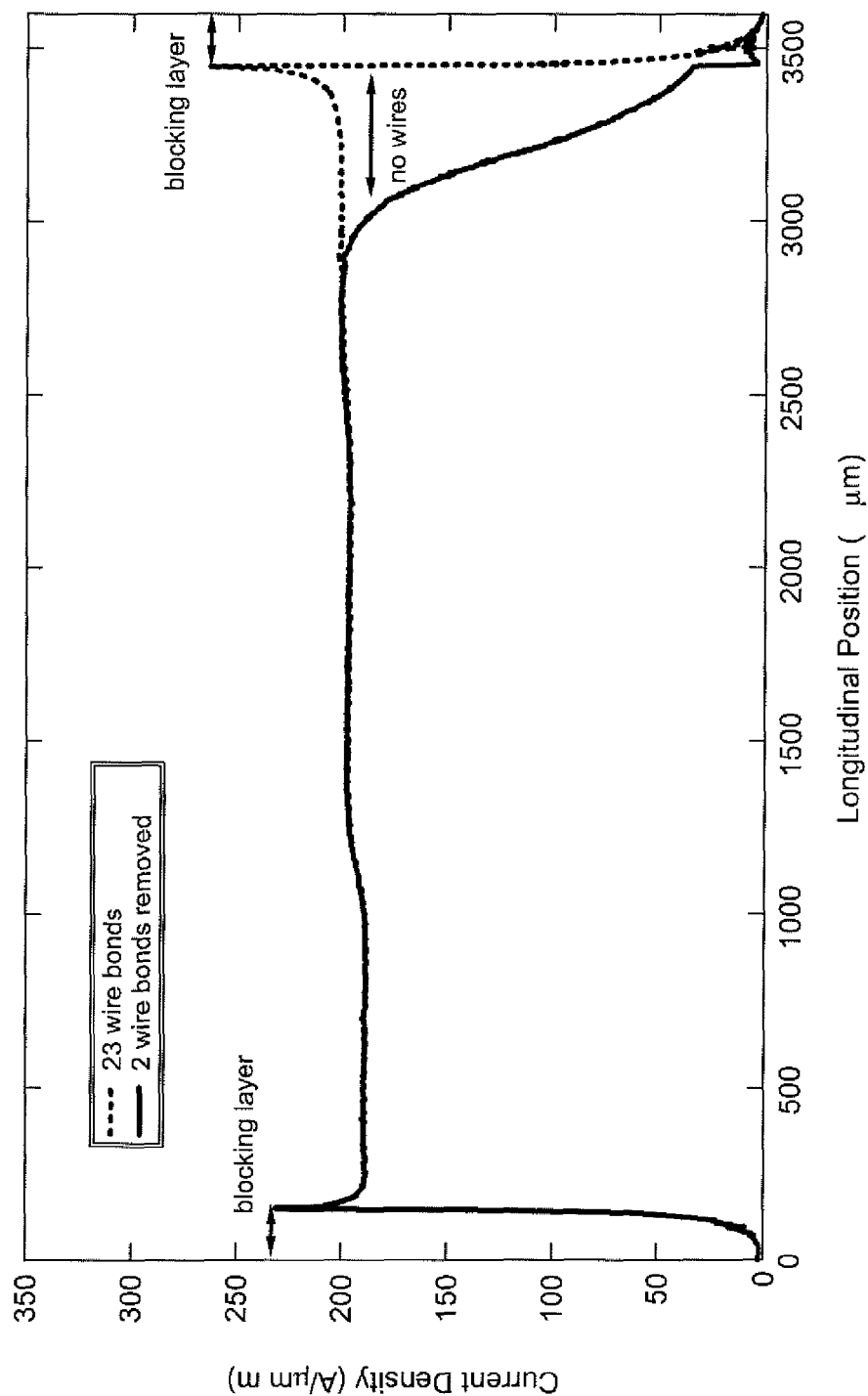
FIG. 8 shows a simulation of the longitudinal current density distribution in the active layer of an exemplary BASE laser diode with a current blocking layer placed at each of the facets and current injection from a plurality of equally distributed wire bonds on top of the device according to the invention, whereby in one example the two wire bonds closest to the front facet are removed.

FIG. 8 shows, as a second example, the current density distribution in the active layer of a 3.6 mm long BASE laser diode. For this design, a current blocking layer of 150-μm length is incorporated between the second metallization (electrode) layer and the second cladding layer (in which the ridge is defined), adjacent to both facets causing the spikes in the current density at the edge of the current blocking layer (i.e. transition between pumped and unpumped regions). The dashed line is obtained for 23 equally distributed wire bonds with a separation of about 50 μm between adjacent bonds. The diameter of each bond is set to 100 μm. The end wires are placed at approximately the same position as the edge of the current blocking layer, similarly starting 170 μm from each facet. Note that the current density distribution between both spikes is not flat because wire bonds on the left side are assumed to be longer. Thus, the series resistance of these wires is higher which decreases the current density on the left side of the device. The solid line shows the improvement if the two last wire bonds on the right hand side (which is the front facet side) are removed so that the last wire bond has a distance of about 450 μm from this facet. Starting at the longitudinal position 3000 μm from the rear facet, the current density strongly decreases in direction to the front facet. Moreover, the current spike is completely removed.

Further advantages may be achieved by placing a plurality of wire bonds in a predetermined pattern, e.g. with uneven spacing as shown in FIG. 3b, or by controlling the supply voltage or current of each and every wire bond. Appropriate arrangement of the wire bonds and/or appropriate control of the voltage/current may achieve practically any desired current density distribution within the laser diode. The person skilled in the art will have no problem of designing a system matching any requirements.

Additional advantages and modifications will readily occur to persons skilled in the art and the invention is therefore not limited to the specific embodiments, details, and steps shown and described herein before.

The invention claimed is:

1. A high power semiconductor laser diode including a semiconductor body having an active region with two end sections and front and back facets terminating said end sections, a first injector over at least part of said semiconductor body for injecting electrons into said active region, a second injector located opposite said first injector over at least part of said semiconductor body for injecting holes into said active region, at least one of said injectors comprising a metallization layer and an electrical connection to said metallization layer, said electrical connection configured as a plurality of point contacts, or a ribbon contact, a distance of the electrical connection to said at least one of the end sections being at least half of an estimated effective penetration depth $\alpha_{eff}$ of current spreading in said active region, and the metallization layer being sufficiently thin such that the degree of carrier injection in the active region decreases continuously throughout at least one of said end sections so as to provide reduced carrier density at at least one of said end sections compared to a section of the active region adjacent the at least one of said end sections, wherein the semiconductor laser diode is a junction-side-down mounted broad area single emitter (BASE) laser diode in which a relatively thick substrate material is sandwiched between the metallization layer of the first injector and the active layer; and wherein said effective penetration depth is based on an approximate analytic expression derived for the junction-side-down mounted BASE laser diode, the analytic expression being shown in the following equation:

$$\alpha_{eff} = \sqrt{2 \frac{\sigma_{cont}}{\sigma_{sub}} d_{sub} d_{cont}}$$

where:

$\sigma_{cont}$ is the conductivity of the metallization layer material;
$\sigma_{sub}$ is the conductivity of the substrate material;
$d_{cont}$ is the vertical thickness of the metallization layer material; and
$d_{sub}$ is the vertical thickness of the substrate material.

2. The laser diode according to claim 1, wherein at least one of the end sections is the region of the laser diode between a facet and said electrical connection.

3. The laser diode according to claim 1, wherein said plurality of point contacts is in the form of a plurality of singular electron or hole injection points extending closely spaced essentially along the length of said laser diode, a first one of said singular injection points being located at a predetermined distance from said front and/or said back facet.

4. The laser diode according to claim 1, wherein the metallization layer is thinner in a portion adjacent one of the facets than in a portion further away from said facet.

5. The laser diode according to claim 1, wherein the metallization layer is sufficiently thin such that at least one part adjacent to at least one end section imparts a voltage drop, thus providing at least one unpumped end section.

6. The laser diode according to claim 1, wherein another of said injectors comprises a second metallization layer and an associated, shaped or unshaped second electrical connection.

7. The laser diode according to claim 1, wherein said at least one injector comprises a plurality of wired contacts.

8. The laser diode according to claim 1, wherein said electrical connection is in the form of a plurality of point contacts and the current to each of said point contacts is controlled to provide a controlled current pattern within the laser diode.

9. The laser diode according to claim 1, further including an injection limiter for limiting the injection of carriers at at least one of said end sections, said injection limiter comprising an insulation layer covering a portion of the laser diode adjacent to a facet such as to further reduce current injection within at least a portion of an end section.

10. The laser diode according to claim 1, wherein the distance of the electrical connection to the at least one of the end sections is at least 100 μm.

11. The laser diode according to claim 1, wherein the distance of the electrical connection to the at least one of the end sections is at least 200 μm.

12. The laser diode according to claim 1, wherein the distance of the electrical connection to the at least one of the end sections is at least 500 μm.

13. The laser diode according to claim 1, wherein the distance of the electrical connection to the at least one of the end sections is between $\alpha_{eff}$ and 3 $\alpha_{eff}$.

* * * * *